(12) United States Patent
Hui et al.

(10) Patent No.: US 11,476,873 B2
(45) Date of Patent: Oct. 18, 2022

(54) SIMPLE PARITY-CHECK BIT COMPUTATION FOR POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US); Michael Breschel, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 87 days.

(21) Appl. No.: 16/754,861

(22) PCT Filed: Oct. 10, 2018

(86) PCT No.: PCT/IB2018/057845
§ 371 (c)(1),
(2) Date: Apr. 9, 2020

(87) PCT Pub. No.: WO2019/073403
PCT Pub. Date: Apr. 18, 2019

(65) Prior Publication Data
US 2020/0313697 A1    Oct. 1, 2020

Related U.S. Application Data

(60) Provisional application No. 62/570,463, filed on Oct. 10, 2017.

(51) Int. Cl.
*H03M 13/00*    (2006.01)
*H03M 13/29*    (2006.01)
(Continued)

(52) U.S. Cl.
CPC ....... *H03M 13/2906* (2013.01); *H03M 13/13* (2013.01); *H04W 88/02* (2013.01)

(58) Field of Classification Search
CPC .. H03M 13/2906; H03M 13/13; H04W 88/02
See application file for complete search history.

(56) References Cited

U.S. PATENT DOCUMENTS

| 6,027,243 A * | 2/2000 | Owada ................ G06F 11/10 |
| | | 714/E11.053 |
| 2014/0208183 A1 | 7/2014 | Mahdavifar et al. |
| 2018/0278272 A1* | 9/2018 | Li .................. H03M 13/6561 |

FOREIGN PATENT DOCUMENTS

WO    WO-2018045788 A1 *    3/2018    ............ H03M 13/13

OTHER PUBLICATIONS

A Semi-Parallel Successive-Cancellation Decoder for Polar Codes by Camille Leroux et al.; Article in IEEE Transactions on Signal Processing—Jan. 2013.

(Continued)

*Primary Examiner* — Samir W Rizk
(74) *Attorney, Agent, or Firm* — Sage Patent Group

(57) ABSTRACT

Methods and systems described herein are directed to encoding information bits for transmission. The methods can include receiving a set of information bits (900) and determining a set of parity check bits (910). The set of information bits is concatenated with the set of parity check bits (920), and the information bits are polar encoded into a set of information bits and frozen bits (930). The encoded set of information bits is transmitted to a wireless receiver (940). In particular embodiments, each parity check bit in the set of parity check bits is the binary sum of the values of all bits in front of it. Other embodiments include generating a set of parity check bits based on a systematic block code on the least reliable bits of the set of information bits. The methods and systems described herein may be applied to 3GPP 5G mobile communication systems.

15 Claims, 6 Drawing Sheets

(51) Int. Cl.
  *H03M 13/13* (2006.01)
  *H04W 88/02* (2009.01)

(56) References Cited

OTHER PUBLICATIONS

Channel Polarization: A Method for Constructing Capacity-Achieving Codes for Symmetric Binary-Input Memoryless Channels by Erdal Arikan; IEEE Transactions on Information Theory, vol. 55, No. 7—Jul. 2009.
List Decoding of Polar Codes by Ido Tal and Alexander Vardy, University of California, San Diego, La Jolla, California—May 2012.
3GPP TSG RAN WG1 Meeting #88bis; Spokane, USA; Source: Spreadtrum Communications; Title: Discussion on the design of PC-polar code (R1-1705155)—Apr. 3-7, 2017.
3GPP TSG RAN WG1 Meeting #88bis; Spokane, USA; Source: NTT DOCOMO; Title: Distributed simple parity check Polar codes (R1-1705757)—Apr. 3-7, 2017.
PCT International Search Report for International application No. PCT/IB2018/057845—Mar. 13, 2019.
PCT Written Opinion of the International Searching Authority for International application No. PCT/IB2018/057845—Mar. 13, 2019.
Parity-Check-Concatenated Polar Codes by Tao Wang et al.; IEEE Communications Letters, vol. 20, No. 12—Dec. 2016.
Hybrid Parity-Check and CRC Aided SCL Decoding for Polar Codes by Qingping Yu et al.; 2016 IEEE International Conference on Internet of Things (iThings) and IEEE Green Computing and Communications (GreenCom) and IEEE Cyber, Physical and Social Computing (CPSCom) and IEEE Smart Data (SmartData)—2016.
Segmented CRC-Aided SC List Polar Decoding by Huayi Zhou et al.; Intel Collaborative Research Institutes on Mobile Networking and Computing, Intel Labs, Shanghai China—2016.
European Office Action for European Patent Application No. 18796756.7 dated Oct. 19, 2021, 10 pages.
Guiping Li et al., "Low Complexity Successive Cancellation List Decoding of CRC-Aided Polar Codes", ICIC Express Letters, vol. 8, No. 2, Dec. 2014, P.R. China, XP009530437, 8 pages.
Guiping Li et al., "An Efficient Construction and Low Complexity Collaborative Decoding of Reed-Solomon Concatenated with Modified Polar Codes", Journal of Communication, vol. 10, No. 3, Mar. 2015, P.R. China, XP055447009, 7 pages.

* cited by examiner

SIMPLE PARITY-CHECK BIT COMPUTATION FOR POLAR CODES

CROSS-REFERENCE TO RELATED APPLICATIONS

The present application claims priority to Provisional Application No. 62/570,463 filed Oct. 10, 2017, entitled "Simple Parity-Check Bit Computation for Polar Codes," the contents of which are incorporated by referenced herein.

PRIORITY

This nonprovisional application is a U.S. National Stage Filing under 35 U.S.C. § 371 of International Patent Application Serial No. PCT/IB2018/057845 filed Oct. 10, 2018 and entitled "SIMPLE PARITY-CHECK BIT COMPUTATION FOR POLAR CODES" which claims priority to U.S. Provisional Patent Application No. 62/570,463 filed Oct. 10, 2017 both of which are hereby incorporated by reference in their entirety.

TECHNICAL FIELD

The present disclosure relates to polar codes in wireless communications and, in particular, parity-check bit computation for polar codes.

BACKGROUND

Polar codes, proposed by Arikan [1], are the first class of constructive coding schemes that are provable to achieve the symmetric capacity of the binary-input discrete memoryless channels under a low-complexity Successive Cancellation (SC) decoder. However, the finite-length performance of polar codes under SC is not competitive compared to other modern channel coding schemes such as Low-Density Parity-Check (LDPC) codes and turbo codes. Later, SC List (SCL) decoder is proposed in [2], which can approach the performance of optimal Maximum-Likelihood (ML) decoder. By concatenating a simple Cyclic Redundancy Check (CRC) coding, it was shown that the performance of concatenated polar code is competitive with that of well-optimized LDPC and turbo codes. As a result, polar codes are being considered as a candidate for future Fifth Generation (5G) wireless communication systems.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code. Loading the data into the proper information bit locations has direct impact on the performance of a polar code. An illustration of the structure of a length-8 polar code is illustrated in FIG. 1.

In general, the set of information bit locations used to carry data varies with the number of channel uses, or equivalently the code length, N as well as the number of data bits, or equivalently the number of information bit locations, K. However, with the commonly used additive white Gaussian noise (AWGN) channel model, for any code length N, if $K_1 < K_2$, then the information set $A_1$ with $K_1$ information bit locations is always a (proper) subset of the information set $A_2$ with $K_2$ information bit locations. As a result, with AWGN channel, for any given code length N, to specify the information sets for all possible number of information bit locations, K, one needs only to store a ranking sequence $S_N$ of bit location indices of length N so that the last (or the first, depending on whether the bit-channel qualities are sorted in ascending or descending order) K indices in $S_N$ is the set of information bit locations if there are K data bits, for any $K \in \{1, 2, \ldots, N\}$. Such a ranking sequence $S_N$ is referred to as the information sequence or Polar sequence, from which the locations of bit-channels for carrying any number of data bits K can be derived.

FIG. 2 illustrates the labeling of the intermediate information bits $s_{l,i}$, where $l \in \{0, 1, \ldots, n\}$ and $i \in \{0, 1, \ldots, N-1\}$ during polar encoding with N=8. The intermediate information bits are related by the following equation:

$$s_{l+1,i} = s_{l,i} \oplus s_{l,i+2^l}, \text{ for}$$

$$i \in \left\{ j \in \{0, 1, \ldots, N-1\}: \text{mod}\left(\left\lfloor \frac{j}{2^l} \right\rfloor, 2\right) = 0 \right\} \text{ and}$$

$$l \in \{0, 1, \ldots, n-1\}$$

$$s_{l+1,i+2^l} = s_{l,i+2^l}, \text{ for } i \in \{j \in \{0, 1, \ldots, N-1\}:$$

$$\text{mod}\left(\left\lfloor \frac{j}{2^l} \right\rfloor, 2\right) = 0\} \text{ and}$$

$$l \in \{0, 1, \ldots, n-1\}$$

with $s_{0,i} \equiv u_i$ be the info bits, and $s_{n,i} \equiv x_i$ be the code bits, for $i \in \{0, 1, \ldots, N-1\}$.

As mentioned above, the bit-channels indices of a Polar code of any given size N can be sorted (e.g., in ascending order) into an index ranking sequence according to their relative qualities or reliabilities when carrying data. Such a sequence that ranks the bit-channel indices is commonly called an information sequence or a Polar sequence.

In the 5G-NR standard, the information sequence or Polar sequence of a Polar code of any size N, up to a maximum of $N_{max}$, is chosen as a sub-sequence of another Polar sequence, denoted by $Q_0^{N_{max}-1} = \{Q_0^{N_{max}}, Q_1^{N_{max}}, \ldots, Q_{N_{max}-1}^{N_{max}}\}$, of bit channel indices for the largest supportable size $N_{max}$, where $N \leq N_{max}$.

This Polar sequence $Q_0^{N_{max}-1} = \{Q_0^{N_{max}}, Q_1^{N_{max}}, \ldots, Q_{N_{max}-1}^{N_{max}}\}$, is given by Table 1, where $0 \leq Q_i^{N_{max}} \leq N_{max}-1$ denotes a bit index before Polar encoding for i=0, 1, ..., N-1 and $N_{max}$=1024. The Polar sequence $Q_0^{N_{max}-1}$ is in ascending order of reliability $W(Q_0^{N_{max}}) < W(Q_1^{N_{max}}) < \ldots < W(Q_{N_{max}-1}^{N_{max}})$, where $W(Q_i^{N_{max}})$ denotes the reliability of bit index $Q_i^{N_{max}}$.

For any code block encoded to N bits, where $N \leq N_{max}$, a same Polar sequence $Q_0^{N-1} = \{Q_0^N, Q_1^N, Q_2^N, \ldots, Q_{N-1}^N\}$ is used, which is a subset or sub-sequence of Polar sequence $Q_0^{N_{max}-1}$ with all elements $\{Q_i^{N_{max}}\}$ of values less than N, ordered in ascending order of reliability $W(Q_0^N) < W(Q_1^N) < W(Q_2^N) < \ldots < W(Q_{N-1}^N)$.

TABLE 1

| Polar sequence $Q_0^{N_{max}-1}$ and its corresponding reliability $W(Q_i^{N_{max}})$ | |
|---|---|
| $W(Q_i^{N_{max}})$ | $Q_i^{N_{max}}$ |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |

TABLE 1-continued

| Polar sequence $Q_0^{N_{max}-1}$ and its corresponding reliability $W(Q_i^{N_{max}})$ | |
|---|---|
| $W(Q_i^{N_{max}})$ | $Q_i^{N_{max}}$ |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |

TABLE 1-continued

Polar sequence $Q_0^{N_{max}-1}$ and its corresponding reliability $W(Q_i^{N_{max}})$

| $W(Q_i^{N_{max}})$ | $Q_i^{N_{max}}$ |
|---|---|
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 193 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296 | 279 |
| 297 | 158 |
| 298 | 337 |
| 299 | 550 |

TABLE 1-continued

Polar sequence $Q_0^{N_{max}-1}$ and its corresponding reliability $W(Q_i^{N_{max}})$

| $W(Q_i^{N_{max}})$ | $Q_i^{N_{max}}$ |
|---|---|
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |

TABLE 1-continued

Polar sequence $Q_0^{N_{max}-1}$ and its corresponding reliability $W(Q_i^{N_{max}})$

| $W(Q_i^{N_{max}})$ | $Q_i^{N_{max}}$ |
|---|---|
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |
| 572 | 591 |
| 573 | 678 |
| 574 | 434 |
| 575 | 677 |
| 576 | 349 |
| 577 | 245 |
| 578 | 458 |
| 579 | 666 |
| 580 | 620 |
| 581 | 363 |
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |

TABLE 1-continued

Polar sequence $Q_0^{N_{max}-1}$ and its corresponding reliability $W(Q_i^{N_{max}})$

| $W(Q_i^{N_{max}})$ | $Q_i^{N_{max}}$ |
|---|---|
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |

TABLE 1-continued

Polar sequence $Q_0^{N_{max}-1}$ and its corresponding reliability $W(Q_i^{N_{max}})$

| $W(Q_i^{N_{max}})$ | $Q_i^{N_{max}}$ |
|---|---|
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |

TABLE 1-continued

Polar sequence $Q_0^{N_{max}-1}$ and its corresponding reliability $W(Q_i^{N_{max}})$

| $W(Q_i^{N_{max}})$ | $Q_i^{N_{max}}$ |
|---|---|
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Polar codes may be used with parity check (PC) bits. Because the minimum-distance property of Polar codes is typically not good, an outer code is often used in combination of a polar code to improve its performance. The encoder of such a concatenation of Polar code and an outer code is shown in FIG. 3, where the outer code is sometimes referred to as a Parity Check (PC) code. Such an outer code, or PC code, generates PC bits based on the data bits, in such a way that each PC bit depends only on the data bits placed before it (but not after it) according to the decoding order in a successive (list) decoder. This property allows an SCL decoder to take advantage of the known relationship between data bits and PC bits to trim the candidate paths during list decoding and thus get rid of the erroneously decoded paths from the list of candidate paths, which in turn improves the error performance of the decoder. The PC bits are sometimes referred to as PC frozen bits or dynamic frozen bits in the 5G-NR standard.

Denote $\overline{Q}_I^N$ as a subset of bit indices in Polar sequence $Q_0^{N-1}$, and $\overline{Q}_F^N$ as the subset of other bit indices in Polar sequence $Q_0^{N-1}$, where $\overline{Q}_I^N$ denote the indices of bit-channels used to carry either data bits or parity check bits, and $\overline{Q}_F^N$ denotes the indices of bits channels that are frozen to known values. Thus, we have $|\overline{Q}_I^N|=K+n_{PC}$, $|\overline{Q}_F^N|=N-|\overline{Q}_I^N|$, where K denotes the number of data bits, and $n_{PC}$ is the number of parity check bits.

In the 5G-NR standard, the location of the PC bits (i.e., the bit indices associated with these PC bits) are computed as follows: Let $G_N=(G_2)^{\otimes n}$ denote the n-th Kronecker power of matrix $G_2$, where $$G_2 = \begin{bmatrix} 1 & 0 \\ 1 & 1 \end{bmatrix}.$$

For a bit index j with j=0, 1, . . . , N−1, denote $g_j$ as the j-th row of $G_N$ and $w(g_j)$ as the row weight of $g_j$, where $w(g_j)$ is the number of ones in $g_j$. Denote the set of bit indices for PC bits as $Q_{PC}^N$, where $|Q_{PC}^N|=n_{PC}$. The PC bits are divided into two kinds: A number of $(n_{PC}-n_{PC}^{wm})$ parity check bits are placed in the $(n_{PC}-n_{PC}^{wm})$ least reliable bit indices in $\overline{Q}_I^N$. A number of $n_{PC}^{wm}$ other parity check bits are placed in the bit indices of minimum row weight in $\check{Q}_I^N$, where $\check{Q}_I^N$ denotes the $|\overline{Q}_I^N|-n_{PC})$ most reliable bit indices in $\overline{Q}_I^N$; if there are more than $n_{PC}^{wm}$ bit indices of the same minimum row weight in $\check{Q}_I^N$, the $n_{PC}^{wm}$ other parity check bits are placed in the $n_{PC}^{wm}$ bit indices of the highest reliability and the minimum row weight in $\tilde{Q}_I^N$.

Generate $u=[u_0\ u_1\ u_2\ \ldots\ u_{N-1}]$ according to the following:

```
k = 0 ;
if n_PC > 0
    y_0 = 0 ; y_1 = 0 ; y_2 = 0 ; y_3 = 0 ; y_4 = 0 ;
    for n = 0 to N −1
        y_t = y_0 ; y_0 = y_1 ; = y_2 ; y_2 = y_3 ; y_3 = y_4 ; y_4 = y_t ;
        if n ∈ Q_I^N
            if n ∈ Q_PC^N
                u_n = y_0 ;
            else
                u_n = c'_k;
                k = k +1 ;
                y_0 = y_0 ⊕ u_n ;
            end if
        else
            u_n = 0 ;
        end if
    end for
```

In the 5G-NR standard, one possible number of PC bits is 3, i.e. $n_{PC}=3$. Given the locations of the $n_{PC}$ PC bits, the 5G-NR standard may compute the values of the PC bits using a length-5 shift register. Specifically, the PC frozen bits value may be generated by a p-length (e.g., p=5) cyclic shift register operation like below:
1. initialize a p-length cyclic shift register, y[0], . . . , y[p−1], to 0
2. go through the elements in $[u_0, u_1, u_2, \ldots, u_{N-1}]$,
   cyclic left shift the register: y[i]=y[(i−1) mod p] for i=0, 1, . . . , p−1.
   if the i-th sub-channel is information: set y[0]=($u_i$ XOR y[0])
   if the i-th sub-channel is PC frozen: set $u_i$=y[0]

SUMMARY

Problems with Existing Solutions

There currently exist certain challenge(s). For example, where 3 PC bits may typically be used in the concatenation of Polar code and PC outer code, a shift-register computation of length 5 is used. However, as constructed, the first PC bit does not depend on any info bits and thus reduces to a regular frozen bit in most cases. Even the 2nd PC bit is also frozen in a significant number of cases. Only the last PC bit is not frozen in most cases. As a result, the effective number of PC bits is often much less than 3, and as a result, the performance benefit of such a small number of PC bits, if any, is quite limited.

On the other hand, because the last PC bit is often situated far away from the first info bit, the shift register computation is non-trivial and incurs significant additional delay and computational complexity, which is hard to justify when the performance benefit is negligible.

BRIEF SUMMARY OF SOME EMBODIMENTS OF THE PRESENT DISCLOSURE/SOLUTION

Certain aspects of the present disclosure and their embodiments may provide solutions to these or other challenges. Parity Check (PC) bits generated by certain outer code, are often placed at certain known specific locations to enhance the performance of SC or SCL decoding of Polar codes. These PC bits are often data dependent so that the decoder can take advantage of the known relationship of these PC bits with other data bits to enhance the Polar code performance. Particular embodiments include simple and effective methods of computing the PC bits. According a particular embodiment, each PC bit is computed by simply performing modulo-2 addition of all the data bits placed in front of the PC bit. This can be implemented using a size-1 shift register, which is simple. According to another embodiment, all PC bits are functions of K_PC least reliable PC bits, where K_PC may be a fixed constant or may be determined based on the code rate of the Polar code. In a special case of this embodiment, the PC bits are simply repetition of the K_PC least reliable PC bits.

Particular embodiments use a simple, low complexity method of coupling some data bits with a special set of "artificially" known bits called Parity Check (PC) bits. The values of these PC bits are data dependent. Two groups of embodiments are described herein, one summing over all previous data bit values, and the other summing over a subset of the least reliable data bits according to a pre-determined parity check matrix.

There are, proposed herein, various embodiments which address one or more of the issues disclosed herein. According to some embodiments, a method performed by a wireless transmitter for encoding information bits comprises: receiving a set of information bits; determining a set of parity check bits; concatenating the set of information bits with the set of parity check bits; Polar encoding the information bits into a set of information bits and frozen bits; and transmitting the encoded set of information bits to a wireless receiver. In particular embodiments, each parity check bit in the set of parity check bits is the binary sum of the values of all bits in front of it (either including or excluding other parity bits in front). Other embodiments include generating a set of parity check bits based on a systematic block code on the least reliable bits of the set of information bits.

According to some embodiments, a method performed by a wireless receiver for decoding information bits comprises: receiving a set of polar coded information bits concatenated with a set of parity check bits, wherein each parity check bit in the set of parity check bits is determined as described in the embodiments above; decoding the set of polar coded information bits concatenated with the set of parity check bits; and terminating the decoding when one of the parity check bits in the set of parity check bits indicates an error.

Certain embodiments may provide one or more of the following technical advantage(s). Particular embodiments improve the error performance of the Polar code (e.g., by reducing the block error rate) with little increase in computational complexity. Another advantage is to provide early termination benefits, because any of the PC bits may be used for error detection.

Various other features and advantages will become apparent to those of ordinary skill in the art, in light of the following written description and accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figures 1, 2:
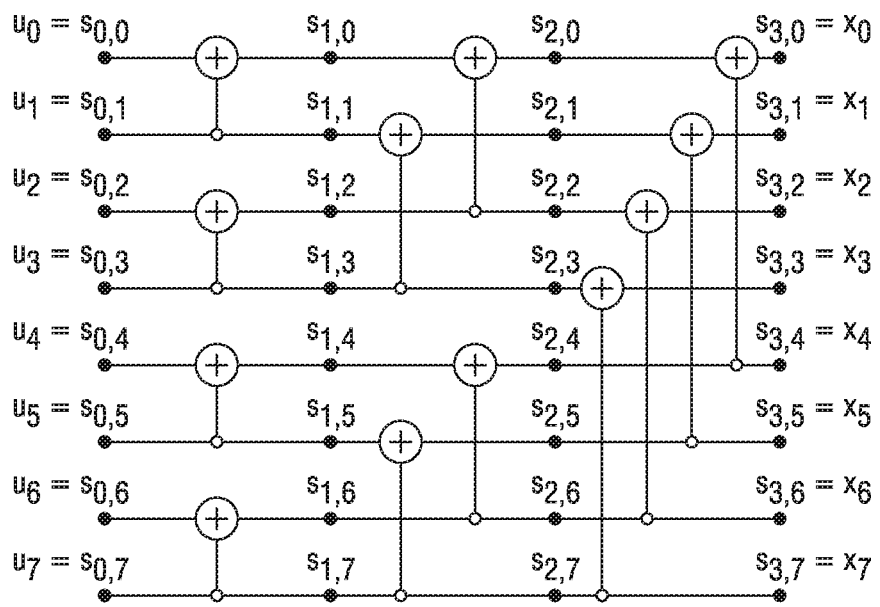
FIG. 1 is an illustration of the structure of a length 8 polar code, according to exemplary embodiments.
FIG. 2 illustrates the labeling of the intermediate information bits where $l \in \{0, 1, \ldots, n\}$ and $i \in \{0, 1, \ldots, N-1\}$ during polar encoding with N=8, according to exemplary embodiments.
Figure 3:
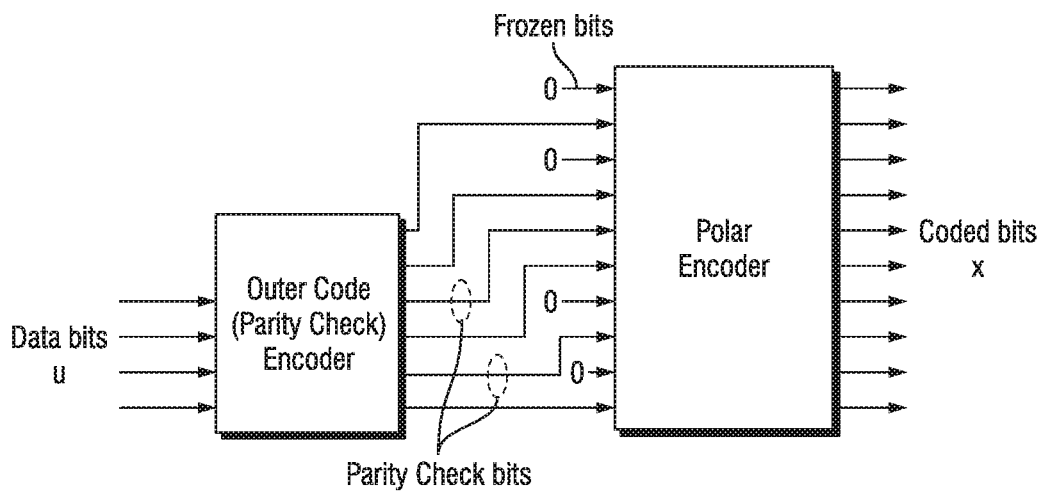
FIG. 3 illustrates an exemplary encoder of a concatenation of polar code and an outer parity check code, according to some embodiments of the present disclosure.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (PGW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

Particular embodiments include parity check (PC) bit generation for Polar codes. The embodiments may be classified into at least two groups of embodiments. A first group of embodiments includes cumulative summation, and a second group includes systematic coding of least reliable data bits.

In the first group of embodiments based on cumulative summation, in a particular embodiment each PC bit is equal to the sum of all previous bits in a non-recursive manner. That is, simple summation of all the information and frozen bits, excluding any previous PC bits, is used to generate the value of each particular PC bit.

Specifically, let $u=[u_0, u_1, \ldots, u_{N-1}]$ represent the input vector of bits to the Polar encoder core, where N is the size of the Polar code, and let P denote the set of predetermined positions of PC bits. Then for each $i \in P$, the value of the corresponding PC bit can be computed simply by $$u_i = \Sigma_{j \in \{0,1,\ldots,N-1\} \backslash P; j \leq i} u_j.$$

In other words, the value of each PC bit is the binary sum (i.e., XOR) of all bit values in front of it, except those values of other PC bits.

In another embodiment, each PC bit is equal to the sum of all previous bits in a recursive manner. That is, simple summation of all the information and frozen bits, including any previous PC bits, is used to generate the value of each particular PC bit. This can be achieved by shift register with feedback.

Specifically, let $P = \{i_0, i_1, \ldots, i_{|P|}\}$ sorted in such a way that $i_m \leq i_n$ whenever $m \leq n$. Incrementing m sequentially from 0 to |P| (the number of elements in P), the value of the m-th PC bit can be computed simply by $$u_{i_m} = \Sigma_{j \in \{0,1,\ldots,N-1\}; j \leq i_m} u_j.$$

In other words, the value of each PC bit is the binary sum (i.e. XOR) of all bit values in front of it, including those values of other previously computed PC bits.

In a second group of embodiments based on systematic coding of least reliable data bits, in a particular embodiment the PC bits are generated based on a systematic block code on the least reliable data bits. Specifically, let $\Lambda \subset \{0, 1, \ldots, N-1\}$ denote the $K_{PC}$ least reliable bit positions among the K bit positions that are chosen to carry data bits, where $|\Lambda|=K_{PC}$ and $K_{PC} \leq K$. Also let $\Phi$ denote a $K_{PC}$ by $n_{PC}$ parity check matrix so that $G=[I,\Phi]$ forms the generator matrix of a $(K_{PC}, K_{PC}+n_{PC})$ systematic code with a good minimum-distance property, where I denotes an $K_{PC}$ by $K_{PC}$ identity matrix. Let $P=\{i_0, i_1, \ldots, i_{|P|-1}\}$ be the position indices of the PC bits. Then for each $i \in P$, the value of the m-th PC bit, where $m=0, 1, \ldots, |P|-1$, and without loss of generality, $|P|=n_{PC}$ is computed as $$u_{i_m} = u_R \cdot [\Phi]_m$$

where $[\Phi]_m$ denotes the m-th column of $\Phi$, and $u_R$ denotes a row vector formed by the elements in the set $\{u_j : j \in \Lambda\}$ with indices sorted in ascending order. The vector $u_R$ contains the data bits that are carried by the $K_{PC}$ least reliable positions.

According to one aspect of this embodiment, the size of the set A (i.e., $K_{PC}$) is selected based on the code rate $R=(K+n_{PC})/M$, where M denotes the code length after rate-matching operations. In general, $K_{PC}$ and $n_{PC}$ are selected so that $K_{PC}/(K_{PC}+n_{PC})$ is comparable to, or slightly below, the code rate R. That is, choosing $(K_{PC}, n_{PC})$ such that $$\frac{K_{PC}}{K_{PC}+n_{PC}} \leq \frac{K+n_{PC}}{M}$$

which provides a guideline for choosing $K_{PC}$ for a given $n_{PC}$.

Figure 4:
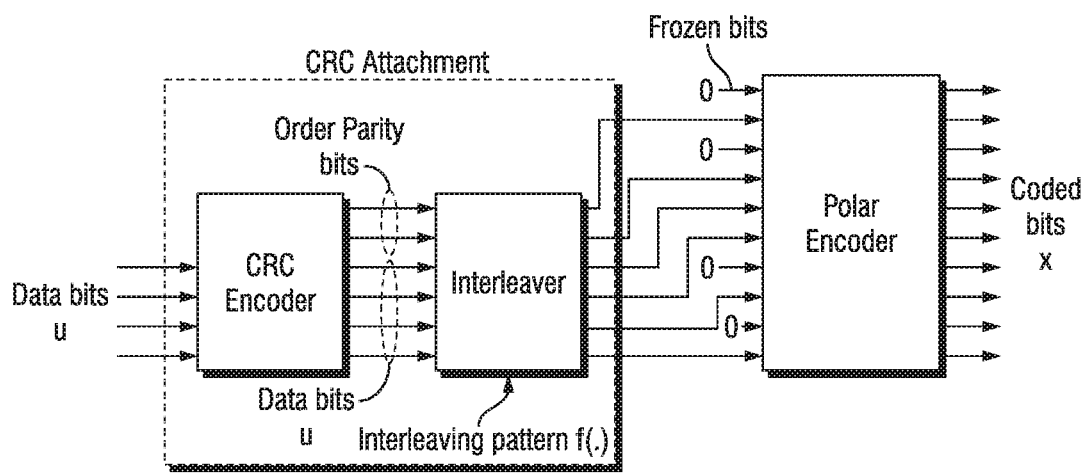
FIG. 4 illustrates an encoder with a cyclic redundancy check attachment, according to various embodiments.
Figure 5:
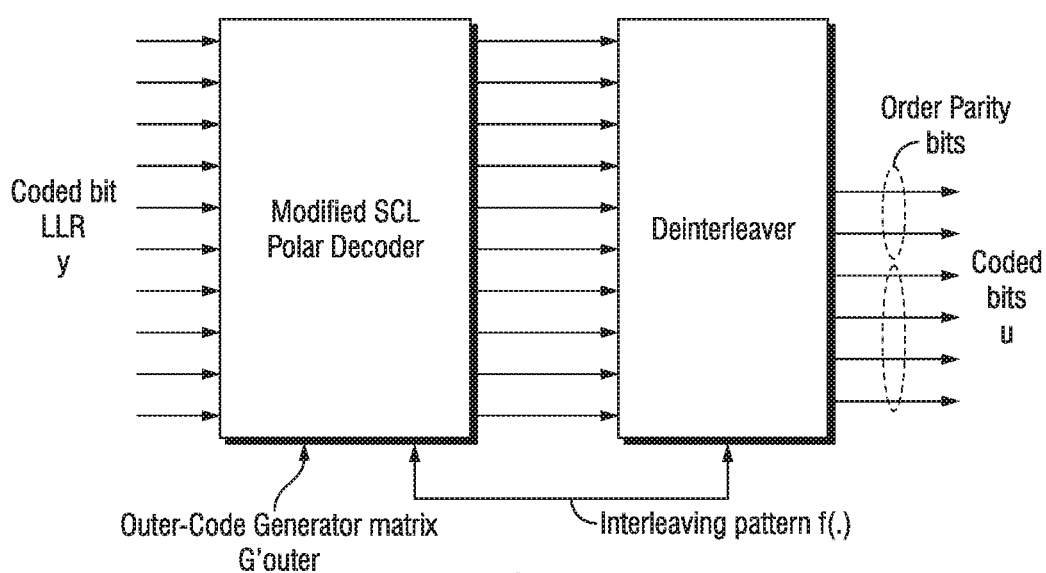
FIG. 5 illustrates a modified successive cancellation list (SCL) Polar decoder and deinterleaver, according to various embodiments.

FIG. 4 illustrates an encoder with a cyclic redundancy check attachment, according to various embodiments. Meanwhile, FIG. 5 illustrates a modified successive cancellation list (SCL) Polar decoder and deinterleaver. Embodiments disclosed herein could, for example, be implemented within environments utilizing such Polar encoding/decoding functionalities.

Figure 6:
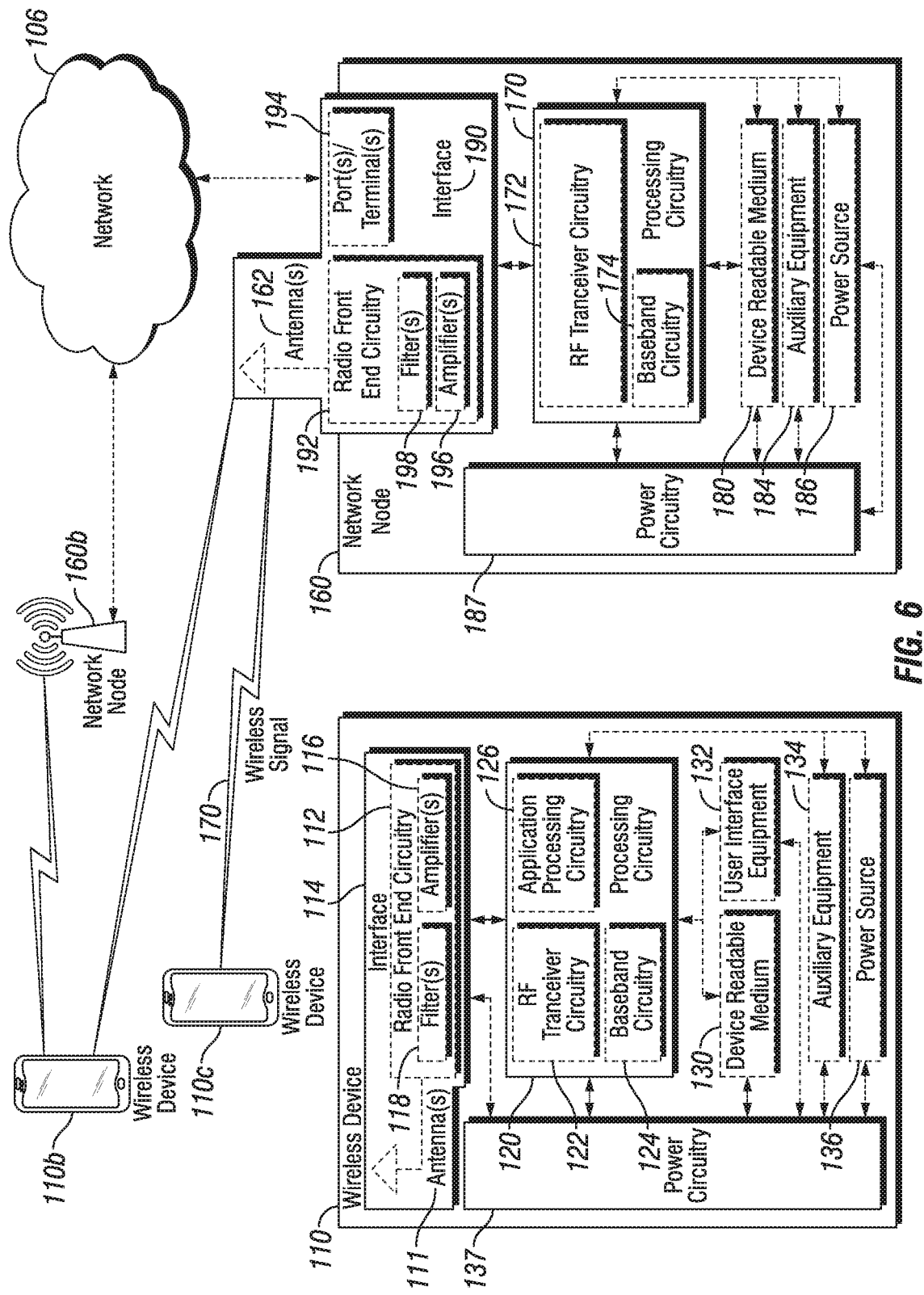
FIG. 6 illustrates an exemplary wireless network, according to various embodiments.

Although the subject matter described herein may be implemented in any appropriate type of system using any suitable components, the embodiments disclosed herein are described in relation to a wireless network, such as the example wireless network illustrated in FIG. 6. For simplicity, the wireless network of FIG. 6 only depicts network 106, network nodes 160 and 160b, and WDs 110, 110b, and 110c. In practice, a wireless network may further include any additional elements suitable to support communication between wireless devices or between a wireless device and another communication device, such as a landline telephone, a service provider, or any other network node or end device. Of the illustrated components, network node 160 and wireless device (WD) 110 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network 106 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 160 and WD 110 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 6, network node 160 includes processing circuitry 170, device readable medium 180, interface 190, auxiliary equipment 184, power source 186, power circuitry 187, and antenna 162. Although network node 160 illustrated in the example wireless network of FIG. 6 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node 160 are depicted as single boxes located within a larger box, or nested within multiple boxes, in practice, a network node may comprise multiple different physical components that make up a single illustrated component (e.g., device readable medium 180 may comprise multiple separate hard drives as well as multiple RAM modules).

Similarly, network node 160 may be composed of multiple physically separate components (e.g., a NodeB component and a RNC component, or a BTS component and a BSC component, etc.), which may each have their own respective components. In certain scenarios in which network node 160 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node 160 may be configured to support multiple radio access technologies (RATs). In such embodiments, some components may be duplicated (e.g., separate device readable medium 180 for the different RATs) and some components may be reused (e.g., the same antenna 162 may be shared by the RATs). Network node 160 may also include multiple sets of the various illustrated components for different wireless technologies integrated into network node 160, such as, for example, GSM, WCDMA, LTE, NR, WiFi, or Bluetooth wireless technologies. These wireless technologies may be integrated into the same or different chip or set of chips and other components within network node 160.

Processing circuitry 170 is configured to perform any determining, calculating, or similar operations (e.g., certain obtaining operations) described herein as being provided by a network node. These operations performed by processing circuitry 170 may include processing information obtained by processing circuitry 170 by, for example, converting the obtained information into other information, comparing the obtained information or converted information to information stored in the network node, and/or performing one or more operations based on the obtained information or converted information, and as a result of said processing making a determination.

Processing circuitry 170 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 160 components, such as device readable medium 180, network node 160 functionality. For example, processing circuitry 170 may execute instructions stored in device readable medium 180 or in memory within processing circuitry 170. Such functionality may include providing any of the various wireless features, functions, or benefits discussed herein. In some embodiments, processing circuitry 170 may include a system on a chip (SOC).

In some embodiments, processing circuitry 170 may include one or more of radio frequency (RF) transceiver circuitry 172 and baseband processing circuitry 174. In some embodiments, radio frequency (RF) transceiver circuitry 172 and baseband processing circuitry 174 may be on separate chips (or sets of chips), boards, or units, such as radio units and digital units. In alternative embodiments, part or all of RF transceiver circuitry 172 and baseband processing circuitry 174 may be on the same chip or set of chips, boards, or units In certain embodiments, some or all of the functionality described herein as being provided by a network node, base station, eNB or other such network device may be performed by processing circuitry 170 executing instructions stored on device readable medium 180 or memory within processing circuitry 170. In alternative embodiments, some or all of the functionality may be provided by processing circuitry 170 without executing instructions stored on a separate or discrete device readable medium, such as in a hard-wired manner. In any of those embodiments, whether executing instructions stored on a device readable storage medium or not, processing circuitry 170 can be configured to perform the described functionality. The benefits provided by such functionality are not limited to processing circuitry 170 alone or to other components of network node 160, but are enjoyed by network node 160 as a whole, and/or by end users and the wireless network generally.

Device readable medium 180 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 170. Device readable medium 180 may store any suitable instructions, data or information, including a computer program, software, an application including one or more of logic, rules, code, tables, etc. and/or other instructions capable of being executed by processing circuitry 170 and, utilized by network node 160. Device readable medium 180 may be used to store any calculations made by processing circuitry 170 and/or any data received via interface 190. In some embodiments, processing circuitry 170 and device readable medium 180 may be considered to be integrated.

Interface 190 is used in the wired or wireless communication of signalling and/or data between network node 160, network 106, and/or WDs 110. As illustrated, interface 190 comprises port(s)/terminal(s) 194 to send and receive data, for example to and from network 106 over a wired connection. Interface 190 also includes radio front end circuitry 192 that may be coupled to, or in certain embodiments a part of, antenna 162. Radio front end circuitry 192 comprises filters 198 and amplifiers 196. Radio front end circuitry 192 may be connected to antenna 162 and processing circuitry 170. Radio front end circuitry may be configured to condition signals communicated between antenna 162 and processing circuitry 170. Radio front end circuitry 192 may receive digital data that is to be sent out to other network nodes or WDs via a wireless connection. Radio front end circuitry 192 may convert the digital data into a radio signal having the appropriate channel and bandwidth parameters using a combination of filters 198 and/or amplifiers 196. The radio signal may then be transmitted via antenna 162. Similarly, when receiving data, antenna 162 may collect radio signals which are then converted into digital data by radio front end circuitry 192. The digital data may be passed to processing circuitry 170. In other embodiments, the interface may comprise different components and/or different combinations of components.

In certain alternative embodiments, network node 160 may not include separate radio front end circuitry 192, instead, processing circuitry 170 may comprise radio front end circuitry and may be connected to antenna 162 without separate radio front end circuitry 192. Similarly, in some embodiments, all or some of RF transceiver circuitry 172 may be considered a part of interface 190. In still other embodiments, interface 190 may include one or more ports or terminals 194, radio front end circuitry 192, and RF transceiver circuitry 172, as part of a radio unit (not shown), and interface 190 may communicate with baseband processing circuitry 174, which is part of a digital unit (not shown).

Antenna 162 may include one or more antennas, or antenna arrays, configured to send and/or receive wireless signals. Antenna 162 may be coupled to radio front end circuitry 190 and may be any type of antenna capable of transmitting and receiving data and/or signals wirelessly. In some embodiments, antenna 162 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna 162 may be separate from network node 160 and may be connectable to network node 160 through an interface or port.

Antenna 162, interface 190, and/or processing circuitry 170 may be configured to perform any receiving operations and/or certain obtaining operations described herein as being performed by a network node. Any information, data and/or signals may be received from a wireless device, another network node and/or any other network equipment. Similarly, antenna 162, interface 190, and/or processing circuitry 170 may be configured to perform any transmitting operations described herein as being performed by a network node. Any information, data and/or signals may be transmitted to a wireless device, another network node and/or any other network equipment.

Power circuitry 187 may comprise, or be coupled to, power management circuitry and is configured to supply the components of network node 160 with power for performing the functionality described herein. Power circuitry 187 may receive power from power source 186. Power source 186 and/or power circuitry 187 may be configured to provide power to the various components of network node 160 in a form suitable for the respective components (e.g., at a voltage and current level needed for each respective component). Power source 186 may either be included in, or external to, power circuitry 187 and/or network node 160. For example, network node 160 may be connectable to an external power source (e.g., an electricity outlet) via an input circuitry or interface such as an electrical cable, whereby the external power source supplies power to power circuitry 187. As a further example, power source 186 may comprise a source of power in the form of a battery or battery pack which is connected to, or integrated in, power circuitry 187. The battery may provide backup power should the external power source fail. Other types of power sources, such as photovoltaic devices, may also be used.

Alternative embodiments of network node 160 may include additional components beyond those shown in FIG. 6 that may be responsible for providing certain aspects of the network node's functionality, including any of the functionality described herein and/or any functionality necessary to support the subject matter described herein. For example, network node 160 may include user interface equipment to allow input of information into network node 160 and to allow output of information from network node 160. This may allow a user to perform diagnostic, maintenance, repair, and other administrative functions for network node 160.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device 110 includes antenna 111, interface 114, processing circuitry 120, device readable medium 130, user interface equipment 132, auxiliary equipment 134, power source 136 and power circuitry 137. WD 110 may include multiple sets of one or more of the illustrated components for different wireless technologies supported by WD 110, such as, for example, GSM, WCDMA, LTE, NR, WiFi, WiMAX, or Bluetooth wireless technologies, just to mention a few. These wireless technologies may be integrated into the same or different chips or set of chips as other components within WD 110.

Antenna 111 may include one or more antennas or antenna arrays, configured to send and/or receive wireless signals, and is connected to interface 114. In certain alternative embodiments, antenna 111 may be separate from WD 110 and be connectable to WD 110 through an interface or port. Antenna 111, interface 114, and/or processing circuitry 120 may be configured to perform any receiving or transmitting operations described herein as being performed by a WD. Any information, data and/or signals may be received from a network node and/or another WD. In some embodiments, radio front end circuitry and/or antenna 111 may be considered an interface.

As illustrated, interface 114 comprises radio front end circuitry 112 and antenna 111. Radio front end circuitry 112 comprise one or more filters 118 and amplifiers 116. Radio front end circuitry 114 is connected to antenna 111 and processing circuitry 120, and is configured to condition signals communicated between antenna 111 and processing circuitry 120. Radio front end circuitry 112 may be coupled to or a part of antenna 111. In some embodiments, WD 110 may not include separate radio front end circuitry 112; rather, processing circuitry 120 may comprise radio front end circuitry and may be connected to antenna 111. Similarly, in some embodiments, some or all of RF transceiver circuitry 122 may be considered a part of interface 114. Radio front end circuitry 112 may receive digital data that is to be sent out to other network nodes or WDs via a wireless connection. Radio front end circuitry 112 may convert the digital data into a radio signal having the appropriate channel and bandwidth parameters using a combination of filters 118 and/or amplifiers 116. The radio signal may then be transmitted via antenna 111. Similarly, when receiving data, antenna 111 may collect radio signals which are then converted into digital data by radio front end circuitry 112. The digital data may be passed to processing circuitry 120. In other embodiments, the interface may comprise different components and/or different combinations of components.

Processing circuitry 120 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD 110 components, such as device readable medium 130, WD 110 functionality. Such functionality may include providing any of the various wireless features or benefits discussed herein. For example, processing circuitry 120 may execute instructions stored in device readable medium 130 or in memory within processing circuitry 120 to provide the functionality disclosed herein.

As illustrated, processing circuitry 120 includes one or more of RF transceiver circuitry 122, baseband processing circuitry 124, and application processing circuitry 126. In other embodiments, the processing circuitry may comprise different components and/or different combinations of components. In certain embodiments processing circuitry 120 of WD 110 may comprise a SOC. In some embodiments, RF transceiver circuitry 122, baseband processing circuitry 124, and application processing circuitry 126 may be on separate chips or sets of chips. In alternative embodiments, part or all of baseband processing circuitry 124 and application processing circuitry 126 may be combined into one chip or set of chips, and RF transceiver circuitry 122 may be on a separate chip or set of chips. In still alternative embodiments, part or all of RF transceiver circuitry 122 and baseband processing circuitry 124 may be on the same chip or set of chips, and application processing circuitry 126 may be on a separate chip or set of chips. In yet other alternative embodiments, part or all of RF transceiver circuitry 122, baseband processing circuitry 124, and application processing circuitry 126 may be combined in the same chip or set of chips. In some embodiments, RF transceiver circuitry 122 may be a part of interface 114. RF transceiver circuitry 122 may condition RF signals for processing circuitry 120.

In certain embodiments, some or all of the functionality described herein as being performed by a WD may be provided by processing circuitry 120 executing instructions stored on device readable medium 130, which in certain embodiments may be a computer-readable storage medium. In alternative embodiments, some or all of the functionality may be provided by processing circuitry 120 without executing instructions stored on a separate or discrete device readable storage medium, such as in a hard-wired manner. In any of those particular embodiments, whether executing instructions stored on a device readable storage medium or not, processing circuitry 120 can be configured to perform the described functionality. The benefits provided by such functionality are not limited to processing circuitry 120 alone or to other components of WD 110, but are enjoyed by WD 110 as a whole, and/or by end users and the wireless network generally.

Processing circuitry 120 may be configured to perform any determining, calculating, or similar operations (e.g., certain obtaining operations) described herein as being performed by a WD. These operations, as performed by processing circuitry 120, may include processing information obtained by processing circuitry 120 by, for example, converting the obtained information into other information, comparing the obtained information or converted information to information stored by WD 110, and/or performing one or more operations based on the obtained information or converted information, and as a result of said processing making a determination.

Device readable medium 130 may be operable to store a computer program, software, an application including one or more of logic, rules, code, tables, etc. and/or other instructions capable of being executed by processing circuitry 120. Device readable medium 130 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry 120. In some embodiments, processing circuitry 120 and device readable medium 130 may be considered to be integrated.

User interface equipment 132 may provide components that allow for a human user to interact with WD 110. Such interaction may be of many forms, such as visual, audial, tactile, etc. User interface equipment 132 may be operable to produce output to the user and to allow the user to provide input to WD 110. The type of interaction may vary depending on the type of user interface equipment 132 installed in WD 110. For example, if WD 110 is a smart phone, the interaction may be via a touch screen; if WD 110 is a smart meter, the interaction may be through a screen that provides usage (e.g., the number of gallons used) or a speaker that provides an audible alert (e.g., if smoke is detected). User interface equipment 132 may include input interfaces, devices and circuits, and output interfaces, devices and circuits. User interface equipment 132 is configured to allow input of information into WD 110, and is connected to processing circuitry 120 to allow processing circuitry 120 to process the input information. User interface equipment 132 may include, for example, a microphone, a proximity or other sensor, keys/buttons, a touch display, one or more cameras, a USB port, or other input circuitry. User interface equipment 132 is also configured to allow output of information from WD 110, and to allow processing circuitry 120 to output information from WD 110. User interface equipment 132 may include, for example, a speaker, a display, vibrating circuitry, a USB port, a headphone interface, or other output circuitry. Using one or more input and output interfaces, devices, and circuits, of user interface equipment 132, WD 110 may communicate with end users and/or the wireless network, and allow them to benefit from the functionality described herein.

Auxiliary equipment 134 is operable to provide more specific functionality which may not be generally performed by WDs. This may comprise specialized sensors for doing measurements for various purposes, interfaces for additional types of communication such as wired communications etc. The inclusion and type of components of auxiliary equipment 134 may vary depending on the embodiment and/or scenario.

Power source 136 may, in some embodiments, be in the form of a battery or battery pack. Other types of power sources, such as an external power source (e.g., an electricity outlet), photovoltaic devices or power cells, may also be used. WD 110 may further comprise power circuitry 137 for delivering power from power source 136 to the various parts of WD 110 which need power from power source 136 to carry out any functionality described or indicated herein. Power circuitry 137 may in certain embodiments comprise power management circuitry. Power circuitry 137 may additionally or alternatively be operable to receive power from an external power source; in which case WD 110 may be connectable to the external power source (such as an electricity outlet) via input circuitry or an interface such as an electrical power cable. Power circuitry 137 may also in certain embodiments be operable to deliver power from an external power source to power source 136. This may be, for example, for the charging of power source 136. Power circuitry 137 may perform any formatting, converting, or other modification to the power from power source 136 to make the power suitable for the respective components of WD 110 to which power is supplied.

Figure 7:
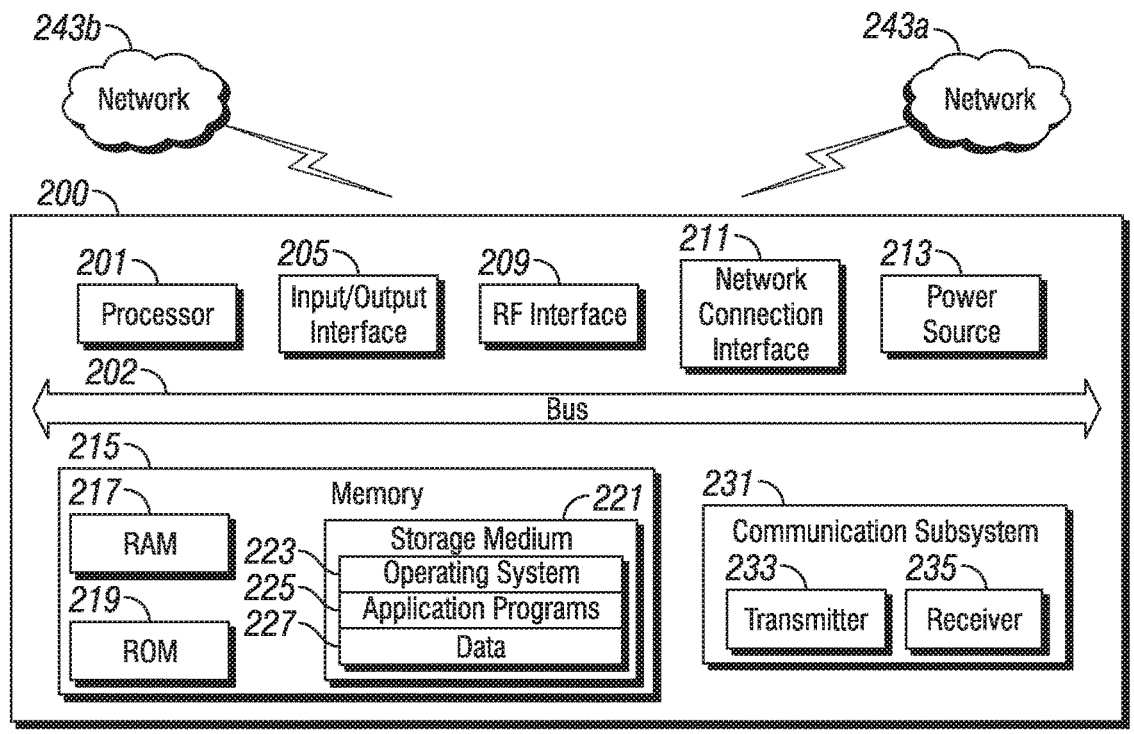
FIG. 7 illustrates example embodiments of a wireless device (or user equipment) in which embodiments of the present disclosure may be implemented, according to various embodiments.

FIG. 7 illustrates one embodiment of a UE in accordance with various aspects described herein. As used herein, a user equipment or UE may not necessarily have a user in the sense of a human user who owns and/or operates the relevant device. Instead, a UE may represent a device that is intended for sale to, or operation by, a human user but which may not, or which may not initially, be associated with a specific human user (e.g., a smart sprinkler controller). Alternatively, a UE may represent a device that is not intended for sale to, or operation by, an end user but which may be associated with or operated for the benefit of a user (e.g., a smart power meter). UE 2200 may be any UE identified by the $3^{rd}$ Generation Partnership Project (3GPP), including a NB-IoT UE, a machine type communication (MTC) UE, and/or an enhanced MTC (eMTC) UE. UE 200, as illustrated in FIG. 7, is one example of a WD configured for communication in accordance with one or more communication standards promulgated by the $3^{rd}$ Generation Partnership Project (3GPP), such as 3GPP's GSM, UMTS, LTE, and/or 5G standards. As mentioned previously, the term WD and UE may be used interchangeable. Accordingly, although FIG. 7 is a UE, the components discussed herein are equally applicable to a WD, and vice-versa.

In FIG. 7, UE 200 includes processing circuitry 201 that is operatively coupled to input/output interface 205, radio frequency (RF) interface 209, network connection interface 211, memory 215 including random access memory (RAM) 217, read-only memory (ROM) 219, and storage medium 221 or the like, communication subsystem 231, power source 233, and/or any other component, or any combination thereof. Storage medium 221 includes operating system 223, application program 225, and data 227. In other embodiments, storage medium 221 may include other similar types of information. Certain UEs may utilize all of the components shown in FIG. 7, or only a subset of the components. The level of integration between the components may vary from one UE to another UE. Further, certain UEs may contain multiple instances of a component, such as multiple processors, memories, transceivers, transmitters, receivers, etc.

In FIG. 7, processing circuitry 201 may be configured to process computer instructions and data. Processing circuitry 201 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry 201 may include two central processing units (CPUs). Data may be information in a form suitable for use by a computer.

In the depicted embodiment, input/output interface 205 may be configured to provide a communication interface to an input device, output device, or input and output device. UE 200 may be configured to use an output device via input/output interface 205. An output device may use the same type of interface port as an input device. For example, a USB port may be used to provide input to and output from UE 200. The output device may be a speaker, a sound card, a video card, a display, a monitor, a printer, an actuator, an emitter, a smartcard, another output device, or any combination thereof. UE 200 may be configured to use an input device via input/output interface 205 to allow a user to capture information into UE 200. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor.

In FIG. 7, RF interface 209 may be configured to provide a communication interface to RF components such as a transmitter, a receiver, and an antenna. Network connection interface 211 may be configured to provide a communication interface to network 243a. Network 243a may encompass wired and/or wireless networks such as a local-area network (LAN), a wide-area network (WAN), a computer network, a wireless network, a telecommunications network, another like network or any combination thereof. For example, network 243a may comprise a Wi-Fi network. Network connection interface 211 may be configured to include a receiver and a transmitter interface used to communicate with one or more other devices over a communication network according to one or more communication protocols, such as Ethernet, TCP/IP, SONET, ATM, or the like. Network connection interface 211 may implement receiver and transmitter functionality appropriate to the communication network links (e.g., optical, electrical, and the like). The transmitter and receiver functions may share circuit components, software or firmware, or alternatively may be implemented separately.

RAM 217 may be configured to interface via bus 202 to processing circuitry 201 to provide storage or caching of data or computer instructions during the execution of software programs such as the operating system, application programs, and device drivers. ROM 219 may be configured to provide computer instructions or data to processing circuitry 201. For example, ROM 219 may be configured to store invariant low-level system code or data for basic system functions such as basic input and output (I/O), startup, or reception of keystrokes from a keyboard that are stored in a non-volatile memory. Storage medium 221 may be configured to include memory such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, or flash drives. In one example, storage medium 221 may be configured to include operating system 223, application program 225 such as a web browser application, a widget or gadget engine or another application, and data file 227. Storage medium 221 may store, for use by UE 200, any of a variety of various operating systems or combinations of operating systems.

Storage medium 221 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium 221 may allow UE 200 to access computer-executable instructions, application programs or the like, stored on transitory or non-transitory memory media, to off-load data, or to upload data. An article of manufacture, such as one utilizing a communication system may be tangibly embodied in storage medium 221, which may comprise a device readable medium.

In FIG. 7, processing circuitry 201 may be configured to communicate with network 243b using communication subsystem 231. Network 243a and network 243b may be the same network or networks or different network or networks. Communication subsystem 231 may be configured to include one or more transceivers used to communicate with network 243b. For example, communication subsystem 231 may be configured to include one or more transceivers used to communicate with one or more remote transceivers of another device capable of wireless communication such as another WD, UE, or base station of a radio access network (RAN) according to one or more communication protocols, such as IEEE 802.2, CDMA, WCDMA, GSM, LTE, UTRAN, WiMax, or the like. Each transceiver may include transmitter 233 and/or receiver 235 to implement transmitter or receiver functionality, respectively, appropriate to the RAN links (e.g., frequency allocations and the like). Further, transmitter 233 and receiver 235 of each transceiver may share circuit components, software or firmware, or alternatively may be implemented separately.

In the illustrated embodiment, the communication functions of communication subsystem 231 may include data communication, voice communication, multimedia communication, short-range communications such as Bluetooth, near-field communication, location-based communication such as the use of the global positioning system (GPS) to determine a location, another like communication function, or any combination thereof. For example, communication subsystem 231 may include cellular communication, Wi-Fi communication, Bluetooth communication, and GPS communication. Network 243b may encompass wired and/or wireless networks such as a local-area network (LAN), a wide-area network (WAN), a computer network, a wireless network, a telecommunications network, another like network or any combination thereof. For example, network 243b may be a cellular network, a Wi-Fi network, and/or a near-field network. Power source 213 may be configured to provide alternating current (AC) or direct current (DC) power to components of UE 200.

The features, benefits and/or functions described herein may be implemented in one of the components of UE 200 or partitioned across multiple components of UE 200. Further, the features, benefits, and/or functions described herein may be implemented in any combination of hardware, software or firmware. In one example, communication subsystem 231 may be configured to include any of the components described herein. Further, processing circuitry 201 may be configured to communicate with any of such components over bus 202. In another example, any of such components may be represented by program instructions stored in memory that when executed by processing circuitry 201 perform the corresponding functions described herein. In another example, the functionality of any of such components may be partitioned between processing circuitry 201 and communication subsystem 231. In another example, the non-computationally intensive functions of any of such components may be implemented in software or firmware and the computationally intensive functions may be implemented in hardware.

Figure 8:
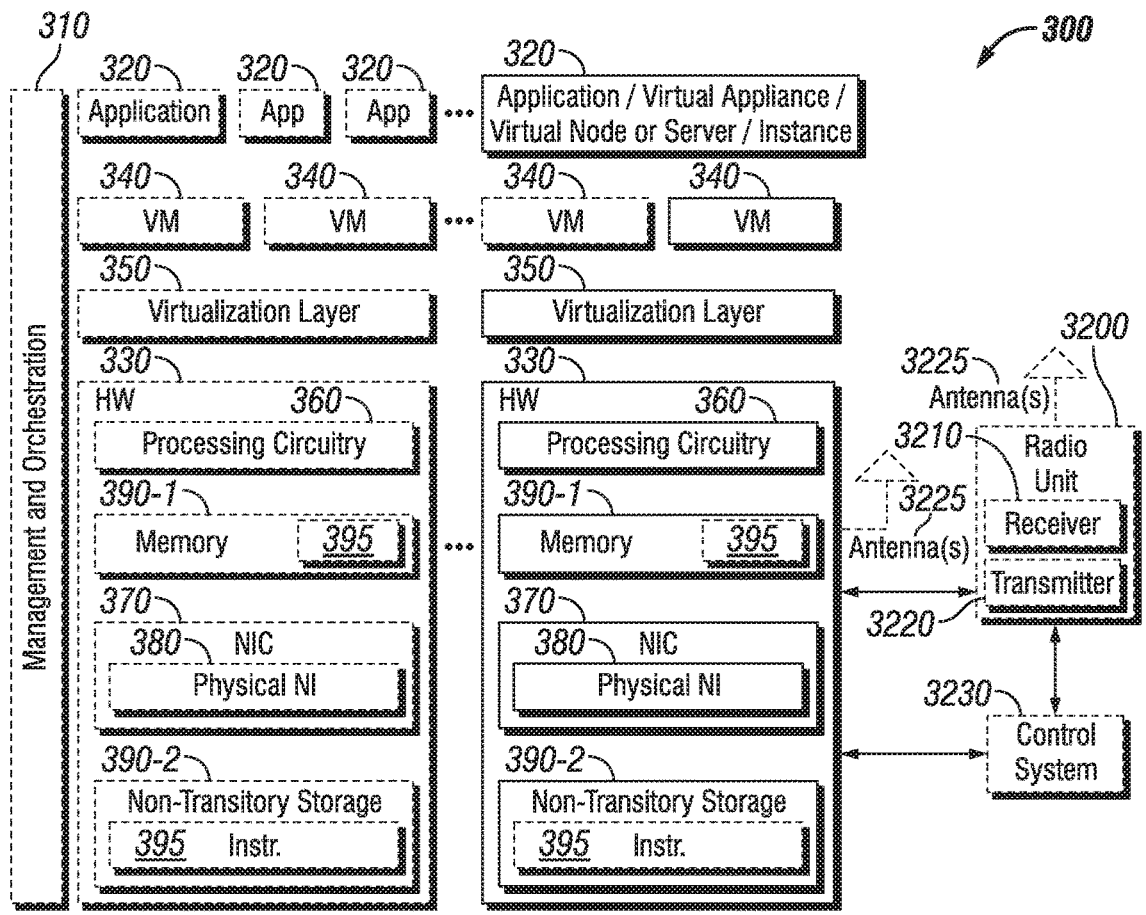
FIG. 8 illustrates a virtualization environment in accordance with exemplary embodiments.

FIG. 8 is a schematic block diagram illustrating a virtualization environment 300 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a UE, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments 300 hosted by one or more of hardware nodes 330. Further, in embodiments in which the virtual node is not a radio access node or does not require radio connectivity (e.g., a core network node), then the network node may be entirely virtualized.

The functions may be implemented by one or more applications 320 (which may alternatively be called software instances, virtual appliances, network functions, virtual nodes, virtual network functions, etc.) operative to implement some of the features, functions, and/or benefits of some of the embodiments disclosed herein. Applications 320 are run in virtualization environment 300 which provides hardware 330 comprising processing circuitry 360 and memory 390. Memory 390 contains instructions 395 executable by processing circuitry 360 whereby application 320 is operative to provide one or more of the features, benefits, and/or functions disclosed herein.

Virtualization environment 300, comprises general-purpose or special-purpose network hardware devices 330 comprising a set of one or more processors or processing circuitry 360, which may be commercial off-the-shelf (COTS) processors, dedicated Application Specific Integrated Circuits (ASICs), or any other type of processing circuitry including digital or analog hardware components or special purpose processors. Each hardware device may comprise memory 390-1 which may be non-persistent memory for temporarily storing instructions 395 or software executed by processing circuitry 360. Each hardware device may comprise one or more network interface controllers (NICs) 370, also known as network interface cards, which include physical network interface 380. Each hardware device may also include non-transitory, persistent, machine-readable storage media 390-2 having stored therein software 395 and/or instructions executable by processing circuitry 360. Software 395 may include any type of software including software for instantiating one or more virtualization layers 350 (also referred to as hypervisors), software to execute virtual machines 340 as well as software allowing it to execute functions, features and/or benefits described in relation with some embodiments described herein.

Virtual machines 340, comprise virtual processing, virtual memory, virtual networking or interface and virtual storage, and may be run by a corresponding virtualization layer 350 or hypervisor. Different embodiments of the instance of virtual appliance 320 may be implemented on one or more of virtual machines 340, and the implementations may be made in different ways.

During operation, processing circuitry 360 executes software 395 to instantiate the hypervisor or virtualization layer 350, which may sometimes be referred to as a virtual machine monitor (VMM). Virtualization layer 350 may present a virtual operating platform that appears like networking hardware to virtual machine 340.

As shown in FIG. 8, hardware 330 may be a standalone network node with generic or specific components. Hardware 330 may comprise antenna 3225 and may implement some functions via virtualization. Alternatively, hardware 330 may be part of a larger cluster of hardware (e.g. such as in a data center or customer premise equipment (CPE)) where many hardware nodes work together and are managed via management and orchestration (MANO) 3100, which, among others, oversees lifecycle management of applications 320.

Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, virtual machine 340 may be a software implementation of a physical machine that runs programs as if they were executing on a physical, non-virtualized machine. Each of virtual machines 340, and that part of hardware 330 that executes that virtual machine, be it hardware dedicated to that virtual machine and/or hardware shared by that virtual machine with others of the virtual machines 340, forms a separate virtual network elements (VNE).

Still in the context of NFV, Virtual Network Function (VNF) is responsible for handling specific network functions that run in one or more virtual machines 340 on top of hardware networking infrastructure 330 and corresponds to application 320 in FIG. 8.

In some embodiments, one or more radio units 3200 that each include one or more transmitters 3220 and one or more receivers 3210 may be coupled to one or more antennas 3225. Radio units 3200 may communicate directly with hardware nodes 330 via one or more appropriate network interfaces and may be used in combination with the virtual components to provide a virtual node with radio capabilities, such as a radio access node or a base station.

In some embodiments, some signaling can be effected with the use of control system 3230 which may alternatively be used for communication between the hardware nodes 330 and radio units 3200.

Figure 9:
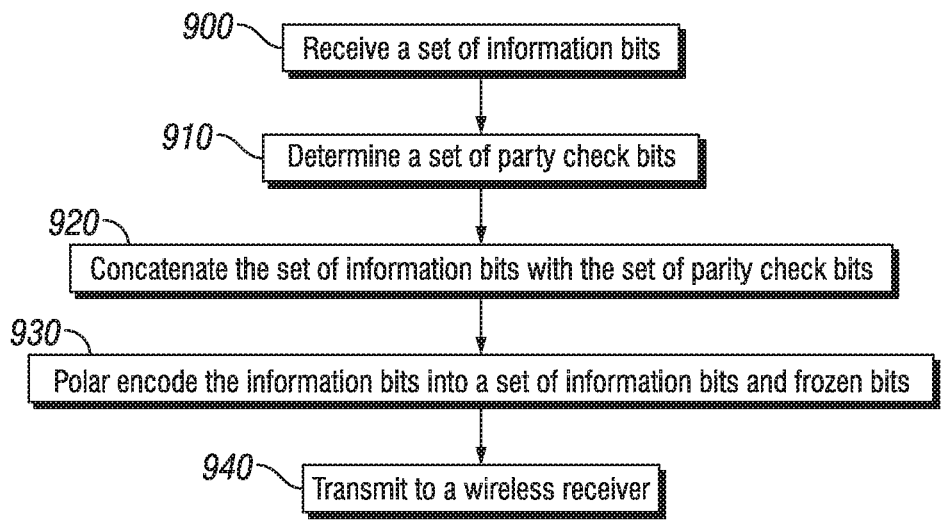
FIG. 9 illustrates a flowchart showing a method of performing various functions described herein, according to various embodiments.

FIG. 9 depicts a method in accordance with particular embodiments, the method begins at step 900 with a wireless transmitter (e.g., wireless device 110, network node 160, etc.) that receives a set of information bits. For example, network node 160 may receive a set of information bits from a higher layer for transmission to wireless device 110.

At step 910, the wireless transmitter determines a set of parity check bits. For example, network node 160 may determine a set of parity check bits by, for each parity check bit in the set, determining the binary sum of all bit values in front of it. Some embodiments may include other parity bits in the sum, while others may not include the parity bit. In other embodiments, network node 160 may generate a set of parity check bits based on a systematic block code on the least reliable bits of the set of information bits and frozen bits. In particular embodiments, the wireless transmitter may determine the set of parity check bits according to any of the embodiments and examples described above.

At step 920, the wireless transmitter concatenates the set of information bits with the set of parity check bits. For example, network node 160 may combine the set of parity check bits with the set of information bits according to any of the embodiments and examples described above.

At step 930, the wireless transmitter Polar encodes the information bits into a set of information bits and frozen bits. For example, network node 160 may encode the information bits according to the Polar encoding algorithm described above.

At step 940, the wireless transmitter transmits the encoded set of bits to a wireless receiver. For example, network node 160 may transmit the concatenated bits to wireless device 110.

Modifications, additions, or omissions may be made to the method illustrated in FIG. 9. Additionally, one or more steps in method the method of FIG. 9 may be performed in parallel or in any suitable order.

Figure 10:
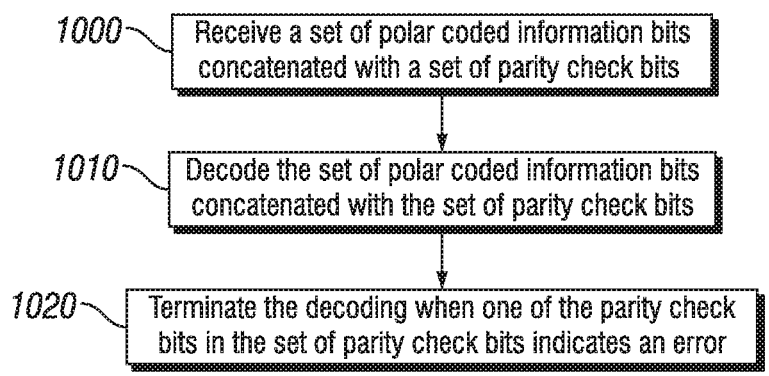
FIG. 10 illustrates a flowchart showing a method of performing various functions described herein, according to various embodiments.

FIG. 10 depicts a method in accordance with particular embodiments, the method begins at step 1000 with a wireless receiver (e.g., wireless device 110, network node 160, etc.) that receives a set of polar coded information bits concatenated with a set of parity check bits. For example, wireless device 110 may receive a set of polar coded information bits concatenated with a set of parity check bits from network node 160 (e.g., as described with respect to FIG. 9).

At step 1010, the wireless receiver polar decodes the set of polar coded information bits concatenated with the set of parity check bits. For example, wireless device 110 may decode the information bits according to the Polar encoding algorithm described above.

At step 1020, the wireless receiver terminates the decoding when one of the parity check bits in the set of parity check bits indicates an error. For example, wireless device 110 may terminate the decoding early once an error is detected, according to any of the embodiments and examples described above.

Modifications, additions, or omissions may be made to the method illustrated in FIG. 10. Additionally, one or more steps in method the method of FIG. 10 may be performed in parallel or in any suitable order.

Figure 11:
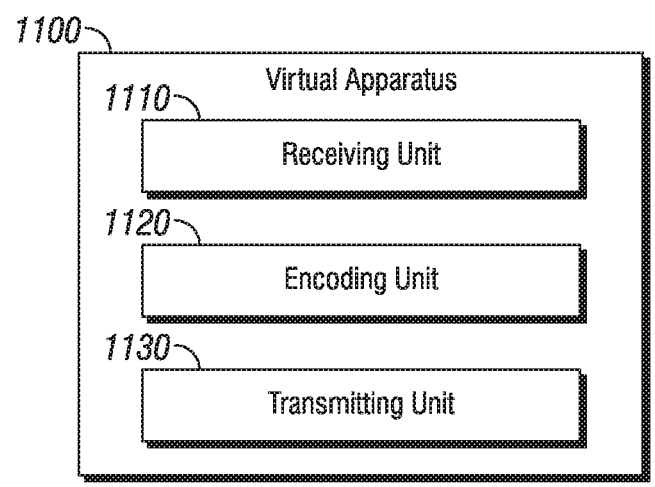
FIG. 11 illustrates an exemplary virtualization apparatus in accordance with various embodiments.

FIG. 11 illustrates a schematic block diagram of an apparatus 1100 in a wireless network (for example, the wireless network shown in FIG. 6). The apparatus may be implemented in a wireless device or network node (e.g., wireless device 110 or network node 160 shown in FIG. 6). Apparatus 1100 is operable to carry out the example method described with reference to FIG. 9 and possibly any other processes or methods disclosed herein. It is also to be understood that the method of FIG. 9 is not necessarily carried out solely by apparatus 1100. At least some operations of the method can be performed by one or more other entities.

Virtual Apparatus 1100 may comprise processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory includes program instructions for executing one or more telecommunications and/or data communications protocols as well as instructions for carrying out one or more of the techniques described herein, in several embodiments. In some implementations, the processing circuitry may be used to cause receiving unit 1110, encoding unit 1120, transmitting unit 1130, and any other suitable units of apparatus 1100 to perform corresponding functions according one or more embodiments of the present disclosure.

As illustrated in FIG. 11, apparatus 1100 includes receiving unit 1110, encoding unit 1120, and transmitting unit 1130. Receiving unit 1110 is configured to receive a set of information bits for encoding and transmission. Encoding unit 1120 is configured to; determine a set of parity check bits; and concatenate the set of information bits with the set of parity check bits; and Polar encode the information bits into a set of information bits and frozen bits. Transmitting unit 1130 is configured to transmit the encoded bits to a wireless receiver.

Figure 12:
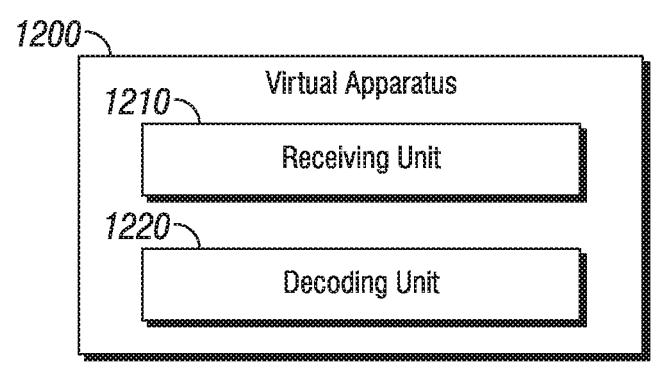
FIG. 12 illustrates an exemplary virtualization apparatus in accordance with various embodiments.

FIG. 12 illustrates a schematic block diagram of an apparatus 1200 in a wireless network (for example, the wireless network shown in FIG. 6). The apparatus may be implemented in a wireless device or network node (e.g., wireless device 110 or network node 160 shown in FIG. 6). Apparatus 1200 is operable to carry out the example method described with reference to FIG. 10 and possibly any other processes or methods disclosed herein. It is also to be understood that the method of FIG. 10 is not necessarily carried out solely by apparatus 1200. At least some operations of the method can be performed by one or more other entities.

Virtual Apparatus 1200 may comprise processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory includes program instructions for executing one or more telecommunications and/or data communications protocols as well as instructions for carrying out one or more of the techniques described herein, in several embodiments. In some implementations, the processing circuitry may be used to cause receiving unit 1210 and decoding unit 1220, and any other suitable units of apparatus 1200 to perform corresponding functions according one or more embodiments of the present disclosure.

As illustrated in FIG. 12, apparatus 1200 includes receiving unit 1210 and decoding unit 1220. Receiving unit 1210 is configured to receive encoded bits, such as the information encoded according to FIG. 9. Decoding unit 1220 is configured to Polar decode the received bits using the parity bits described in the embodiments and examples described above.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Those skilled in the art will recognize improvements and modifications to the embodiments of the present disclosure. All such improvements and modifications are considered within the scope of the concepts disclosed herein.

REFERENCE LIST

[1] E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009.
[2] I. Tal and A. Vardy, "List Decoding of polar codes," in Proceedings of IEEE Symp. Inf. Theory, pp. 1-5, 2011.
[3] Leroux, et. al., "A Semi-Parallel Successive-Cancellation Decoder for Polar Codes," IEEE TRANSACTIONS ON SIGNAL PROCESSING, VOL. 61, NO. 2, Jan. 15, 2013.

Abbreviations

At least some of the following abbreviations may be used in this disclosure. If there is an inconsistency between abbreviations, preference should be given to how it is used above. If listed multiple times below, the first listing should be preferred over any subsequent listing(s).
1×RTT CDMA2000 1× Radio Transmission Technology
3GPP 3rd Generation Partnership Project
5G 5th Generation
ABS Almost Blank Subframe
ARQ Automatic Repeat Request
AWGN Additive White Gaussian Noise
BCCH Broadcast Control Channel
BCH Broadcast Channel
CA Carrier Aggregation
CC Carrier Component
CCCH SDU Common Control Channel SDU
CDMA Code Division Multiplexing Access
CGI Cell Global Identifier
CIR Channel Impulse Response
CP Cyclic Prefix
CPICH Common Pilot Channel
CPICH Ec/No CPICH Received energy per chip divided by the power density in the band
CQI Channel Quality information
C-RNTI Cell RNTI
CSI Channel State Information
DCCH Dedicated Control Channel
DCI Downlink Control Information
DFTS OFDM Discrete Fourier Transform Spread OFDM
DL Downlink
DM Demodulation
DMRS Demodulation Reference Signal
DRX Discontinuous Reception
DTX Discontinuous Transmission
DTCH Dedicated Traffic Channel
DUT Device Under Test
E-CID Enhanced Cell-ID (positioning method)
E-SMLC Evolved-Serving Mobile Location Centre
ECGI Evolved CGI
eNB E-UTRAN NodeB
ePDCCH enhanced Physical Downlink Control Channel
E-SMLC evolved Serving Mobile Location Center
E-UTRA Evolved UTRA
E-UTRAN Evolved UTRAN
FDD Frequency Division Duplex
FFS For Further Study
GERAN GSM EDGE Radio Access Network
gNB Base station in NR
GNSS Global Navigation Satellite System
GSM Global System for Mobile communication
HARQ Hybrid Automatic Repeat Request
HO Handover
HSPA High Speed Packet Access
HRPD High Rate Packet Data
IR-HARQ Incremental Redundancy HARQ
LLR Log Likelihood Ratio
LOS Line of Sight
LPP LTE Positioning Protocol
LTE Long-Term Evolution
MAC Medium Access Control
MBMS Multimedia Broadcast Multicast Services
MBSFN Multimedia Broadcast multicast service Single Frequency Network
MBSFN ABS MBSFN Almost Blank Subframe
MDT Minimization of Drive Tests
MIB Master Information Block
MME Mobility Management Entity
MSC Mobile Switching Center
NPDCCH Narrowband Physical Downlink Control Channel
NR New Radio
OCNG OFDMA Channel Noise Generator
OFDM Orthogonal Frequency Division Multiplexing
OFDMA Orthogonal Frequency Division Multiple Access
OSS Operations Support System
OTDOA Observed Time Difference of Arrival
O&M Operation and Maintenance
PBCH Physical Broadcast Channel
P-CCPCH Primary Common Control Physical Channel
PCell Primary Cell
PCFICH Physical Control Format Indicator Channel
PDCCH Physical Downlink Control Channel
PDP Profile Delay Profile
PDSCH Physical Downlink Shared Channel
PGW Packet Gateway
PHICH Physical Hybrid-ARQ Indicator Channel
PLMN Public Land Mobile Network
PMI Precoder Matrix Indicator
PRACH Physical Random Access Channel
PRS Positioning Reference Signal
PSS Primary Synchronization Signal
PUCCH Physical Uplink Control Channel
PUSCH Physical Uplink Shared Channel
RACH Random Access Channel
QAM Quadrature Amplitude Modulation
RAN Radio Access Network
RAT Radio Access Technology
RLM Radio Link Management
RNC Radio Network Controller
RNTI Radio Network Temporary Identifier
RRC Radio Resource Control
RRM Radio Resource Management
RS Reference Signal
RSCP Received Signal Code Power
RSRP Reference Symbol Received Power OR Reference Signal Received Power
RSRQ Reference Signal Received Quality OR Reference Symbol Received Quality
RSSI Received Signal Strength Indicator
RSTD Reference Signal Time Difference
SC Successive Cancellation
SCL Successive Cancellation List
SCH Synchronization Channel SCell Secondary Cell
SDU Service Data Unit
SFN System Frame Number
SGW Serving Gateway
SI System Information
SIB System Information Block
SNR Signal to Noise Ratio
SON Self Optimized Network
SS Synchronization Signal
SSB Synchronization Signal Block
SSS Secondary Synchronization Signal
TDD Time Division Duplex
TDOA Time Difference of Arrival
TOA Time of Arrival
TSS Tertiary Synchronization Signal
TTI Transmission Time Interval
UCI Uplink Control Information
UE User Equipment
UL Uplink
UMTS Universal Mobile Telecommunication System
USIM Universal Subscriber Identity Module
UTDOA Uplink Time Difference of Arrival
UTRA Universal Terrestrial Radio Access
UTRAN Universal Terrestrial Radio Access Network
WCDMA Wide CDMA
WLAN Wide Local Area Network

What is claimed is:

1. A method performed by a wireless transmitter for encoding information bits, the method comprising:
receiving a set of information bits;
determining a set of parity check bits, wherein each parity check bit in the set of parity check bits is the binary sum of values of all bits in front of it;
concatenating the set of information bits with the set of parity check bits;
polar encoding the information bits into a set of information bits and frozen bits; and
transmitting the encoded set of information bits to a wireless receiver.

2. The method of claim 1, wherein each parity check bit in the set of parity check bits is the binary sum of all bits values in front of it, except for other parity check bits.

3. The method of claim 1, wherein the bits in front of each parity check bit in the set of parity check bits includes at least one preceding parity check bit.

4. A wireless device for encoding information bits, the wireless device comprising:
processing circuitry configured to perform any of the steps of claim 1; and
power supply circuitry configured to supply power to the wireless device.

5. A base station for encoding information bits, the base station comprising:
processing circuitry configured to perform any of the steps of claim 1; and
power supply circuitry configured to supply power to the base station.

6. A user equipment (UE) for encoding information bits, the UE comprising:
an antenna configured to send and receive wireless signals;
radio front-end circuitry connected to the antenna and to processing circuitry, and configured to condition signals communicated between the antenna and the processing circuitry;
the processing circuitry being configured to perform any of the steps of claim 1;
an input interface connected to the processing circuitry and configured to allow input of information into the UE to be processed by the processing circuitry;
an output interface connected to the processing circuitry and configured to output information from the UE that has been processed by the processing circuitry; and
a battery connected to the processing circuitry and configured to supply power to the UE.

7. A method performed by a wireless receiver for decoding information bits, the method comprising:
receiving a set of polar coded information bits concatenated with a set of parity check bits, wherein each parity check bit in the set of parity check bits is the binary sum of values of all bits in front of it;
decoding the set of polar coded information bits concatenated with the set of parity check bits; and
terminating the decoding when one of the parity check bits in the set of parity check bits indicates an error.

8. The method of claim 7, wherein each parity check bit in the set of parity check bits is the binary sum of the values of all bits in front of it, except for other parity check bits.

9. The method of claim 7, wherein the bits in front of each parity check bit in the set of parity check bits includes at least one preceding parity check bit.

10. A non-transitory computer-readable medium storing instructions thereon for, when executed by at least one processor, performing a method by a wireless transmitter for encoding information bits, the method comprising:
receiving a set of information bits;
determining a set of parity check bits, wherein each parity check bit in the set of parity check bits is the binary sum of values all bits in front of it;
concatenating the set of information bits with the set of parity check bits;
polar encoding the information bits into a set of information bits and frozen bits; and
transmitting the encoded set of information bits to a wireless receiver.

11. The non-transitory computer-readable medium of claim 10, wherein each parity check bit in the set of parity check bits is the binary sum of values of all bits in front of it, except for other parity check bits.

12. The non-transitory computer-readable medium of claim 10, wherein the bits in front of each parity check bit in the set of parity check bits includes at least one preceding parity check bit.

13. A non-transitory computer-readable medium storing instructions thereon for, when executed by at least one processor, performing a method by a wireless receiver for decoding information bits, the method comprising:
receiving a set of polar coded information bits concatenated with a set of parity check bits, wherein each parity check bit in the set of parity check bits is the binary sum of values of all bits in front of it;
decoding the set of polar coded information bits concatenated with the set of parity check bits; and
terminating the decoding when one of the parity check bits in the set of parity check bits indicates an error.

14. The non-transitory computer-readable medium of claim 13, wherein each parity check bit in the set of parity check bits is the binary sum of the values of all bits values in front of it, except for other parity check bits.

15. The non-transitory computer-readable medium of claim 13, wherein the bits in front of each parity check bit in the set of parity check bits includes at least one preceding parity check bit.

* * * * *